(12) United States Patent
Lv et al.

(10) Patent No.: US 12,323,120 B2
(45) Date of Patent: Jun. 3, 2025

(54) BULK ACOUSTIC WAVE RESONATOR AND FABRICATION METHOD FOR THE BULK ACOUSTIC WAVE RESONATOR

(71) Applicant: MEMSensing Microsystems (Suzhou, China) Co., Ltd., Suzhou (CN)

(72) Inventors: Ping Lv, Suzhou (CN); Gang Li, Suzhou (CN); Wei Hu, Suzhou (CN)

(73) Assignee: MEMSensing Microsystems (Suzhou, China) Co., Ltd., Suzhou (CN)

( * ) Notice: Subject to any disclaimer, the term of this patent is extended or adjusted under 35 U.S.C. 154(b) by 769 days.

(21) Appl. No.: 17/351,594

(22) Filed: Jun. 18, 2021

(65) Prior Publication Data

US 2021/0313946 A1 Oct. 7, 2021

Related U.S. Application Data

(63) Continuation of application No. PCT/CN2019/119746, filed on Nov. 20, 2019.

(30) Foreign Application Priority Data

Dec. 20, 2018 (CN) .......................... 201811564949.9

(51) Int. Cl.
*H03H 9/17* (2006.01)
*H03H 3/02* (2006.01)
*H03H 9/13* (2006.01)

(52) U.S. Cl.
CPC ................ *H03H 3/02* (2013.01); *H03H 9/13* (2013.01); *H03H 9/17* (2013.01)

(58) Field of Classification Search
CPC ................................... H03H 9/13; H03H 9/17
See application file for complete search history.

(56) References Cited

U.S. PATENT DOCUMENTS

| 2008/0116999 | A1 | 5/2008 | Park et al. |
| 2016/0182008 | A1 | 6/2016 | Bhattacharjee et al. |
| 2017/0250671 | A1 | 8/2017 | Omura et al. |
| 2018/0054176 | A1 | 2/2018 | Kim et al. |

(Continued)

FOREIGN PATENT DOCUMENTS

| CN | 101692602 A | 4/2010 |
| CN | 102122940 A | 7/2011 |

(Continued)

OTHER PUBLICATIONS

International Search Report and Written Opinion issued in corresponding PCT Application No. PCT/CN2019/119746, dated Feb. 27, 2020.

*Primary Examiner* — Bryan P Gordon
(74) *Attorney, Agent, or Firm* — Westbridge IP LLC

(57) ABSTRACT

Disclosed are a bulk acoustic wave resonator and a fabrication method for the bulk acoustic wave resonator. The fabrication method includes: preparing a cavity with a top opening on a first silicon wafer; preparing an insulating layer on an upper surface of a second silicon wafer, and preparing a resonant piezoelectric stack on an upper surface of the insulating layer; preparing a first silicon dioxide layer on an upper surface of the resonant piezoelectric stack; bonding a surface where the top opening of the cavity is located with an upper surface of the first silicon dioxide layer; and preparing a lead out pad of the first electrode and the second electrode.

8 Claims, 10 Drawing Sheets

(56) References Cited

U.S. PATENT DOCUMENTS

| | | | |
|---|---|---|---|
| 2018/0083182 A1* | 3/2018 | Shin | H03H 9/175 |
| 2018/0123554 A1* | 5/2018 | Kyoung | H03H 9/02118 |
| 2018/0309428 A1* | 10/2018 | Lim | H03H 9/173 |
| 2019/0379344 A1* | 12/2019 | Wang | H03H 9/1021 |
| 2020/0021267 A1* | 1/2020 | Swamy | H03H 9/145 |

FOREIGN PATENT DOCUMENTS

| | | | |
|---|---|---|---|
| CN | 103051302 A | 4/2013 | |
| CN | 104767500 A | 7/2015 | |
| CN | 105784189 A | 7/2016 | |
| CN | 106100601 A | 11/2016 | |
| CN | 107093994 A | 8/2017 | |
| CN | 107222181 A | 9/2017 | |
| CN | 107947750 A | 4/2018 | |
| CN | 108362408 A | 8/2018 | |
| CN | 109831172 A | 5/2019 | |

* cited by examiner

BULK ACOUSTIC WAVE RESONATOR AND FABRICATION METHOD FOR THE BULK ACOUSTIC WAVE RESONATOR

CROSS-REFERENCE TO RELATED APPLICATIONS

This application is a continuation of International Application No. PCT/CN2019/119746 filed on Nov. 20, 2019, which claims priority to Chinese patent application No. 201811564949.9 filed on Dec. 20, 2018. Both applications are incorporated herein by reference in their entireties.

TECHNICAL FIELD

The disclosure relates to the field of Micro-Electro-Mechanical System (MEMS) devices technologies, in particular to a bulk acoustic wave resonator and a fabrication method for the bulk acoustic wave resonator.

BACKGROUND

In order to meet requirements of quality of a radio frequency signal in wireless communication technology, a bulk acoustic wave resonator has been a research hotspot in recent years. Among them, the Film Bulk Acoustic-wave Resonator (FBAR) and its derivative Lamb Wave Resonator (LWR), with the advantages of a smaller size, lower insertion loss, better out-of-band rejection, higher power handling and easy integration, has become a latest generation of bulk acoustic wave resonator.

However, for bulk acoustic wave resonator, in order to form an acoustic isolation region under a resonant piezoelectric stack, a large cavity is usually necessary to be prepared under the resonant piezoelectric stack. A formation of the cavity results in poor structure stability of a device. Taking FBAR as an example, FIG. 1 is a schematic diagram of a structure of FBAR in the prior art. As shown in FIG. 1, FBAR 100 includes a silicon substrate 101, a supporting layer 103, a first electrode 104, a piezoelectric film 105, and a second electrode 106, which are sequentially stacked from bottom to top. The silicon substrate 101 includes a back side etched cavity 102. The back side etched cavity 102 is obtained by back-etching a silicon wafer forming the silicon substrate 101, thereby forming a isolation region of an acoustic wave to confine the acoustic wave by a resonant piezoelectric stack composed of the first electrode 104, the piezoelectric film 105 and the second electrode 106, thereby effectively preventing sound leakage. However, in FBAR with this structure, in order to form the back side etched cavity 102, the silicon wafer needs to be etched away in a large area, resulting in the poor structure stability of the device.

SUMMARY

In view of this, embodiments of the present application are dedicated to providing a bulk acoustic wave resonator and a fabrication method for the bulk acoustic wave resonator, so as to solve a problem of poor stability of the bulk acoustic wave resonator in the prior art.

In a first aspect, the present application provides a fabrication method for the bulk acoustic wave resonator, including: providing a first silicon wafer, and preparing a cavity with a top opening on the first silicon wafer; providing a second silicon wafer, preparing an insulating layer on an upper surface of the second silicon wafer, and preparing a resonant piezoelectric stack on an upper surface of the insulating layer, the resonant piezoelectric stack including a piezoelectric film, and a first electrode and a second electrode that are in contact with the piezoelectric film and are independent of each other; preparing a first silicon dioxide layer on an upper surface of the resonant piezoelectric stack, the upper surface of the resonant piezoelectric stack including one or more of a surface of the piezoelectric film, a surface of the first electrode, and a surface of the second electrode; bonding a surface where the top opening of the cavity is located with an upper surface of the first silicon dioxide layer; and preparing a lead out pad of the first electrode and the second electrode.

In an embodiment, the preparing a resonant piezoelectric stack on an upper surface of the insulating layer, the resonant piezoelectric stack including a piezoelectric film and a first electrode and a second electrode that are in contact with the piezoelectric film and are independent of each other includes: growing a first metal layer on the upper surface of the insulating layer; growing the piezoelectric film on an upper surface of the first metal layer; growing a second metal layer on an upper surface of the piezoelectric film; and forming, by the first metal layer, the first electrode, and forming, by the second metal layer, the second electrode.

In an embodiment, the piezoelectric film is doped with metal elements.

In an embodiment, after the growing a first metal layer on the upper surface of the insulating layer, the fabrication method further including: etching the first metal layer to form a first interdigital transducers (IDT) finger and a second IDT finger, the first IDT finger including at least one first finger, the second IDT finger including at least one second finger, the at least one first finger and the at least one second finger alternately arranged at an interval; after the growing a second metal layer on an upper surface of the piezoelectric film, further including: etching the second metal layer to form a third IDT finger and a fourth IDT finger, orthographic projections of the third IDT finger and the fourth IDT finger overlapping with the first IDT finger and the second IDT finger respectively; and forming, by the first IDT finger, the first electrode, and forming, by the second IDT finger, the second electrode.

In an embodiment, the preparing a resonant piezoelectric stack on an upper surface of the insulating layer, the resonant piezoelectric stack including a piezoelectric film and a first electrode and a second electrode that are in contact with the piezoelectric film and are independent of each other includes: growing a first metal layer on the upper surface of the insulating layer; etching the first metal layer to form a first IDT finger electrode and a second IDT finger electrode, the first IDT finger electrode including at least one first IDT finger, the second IDT finger electrode including at least one second IDT finger, the at least one first IDT finger and the at least one second IDT finger alternately arranged at an interval; growing the piezoelectric film on the upper surface of the insulating layer, an upper surface of the first IDT finger electrode, and an upper surface of the second IDT finger electrode; and forming, by the first IDT finger electrode, the first electrode, and forming, by the second IDT finger electrode, the second electrode.

In an embodiment, after the bonding a surface where the top opening of the cavity is located with an upper surface of the first silicon dioxide layer, the preparation method further including: etching off the second silicon wafer to expose the insulating layer; and etching, at periphery of the first IDT finger electrode and the second IDT finger electrode, a groove downward from a surface of the insulating layer to connect to the cavity.

In an embodiment, the groove includes a first channel and a second channel, and the first channel and the second channel successively surround the first IDT finger electrode and the second IDT finger electrode at a predetermined interval.

In an embodiment, the providing a first silicon wafer, and preparing a cavity with a top opening on the first silicon wafer includes: providing the first silicon wafer; growing a second silicon dioxide layer on an upper surface of the first silicon wafer; and etching, by using the second silicon dioxide layer as a mask, the cavity in the first silicon wafer.

In an embodiment, the providing a first silicon wafer, and preparing a cavity with a top opening on the first silicon wafer includes: providing the first silicon wafer; and etching, by using photoresist as a mask, the cavity in the first silicon wafer.

In an embodiment, an orthographic projection of the first electrode and/or the second electrode in a vertical direction is an irregular polygon.

In an embodiment, a depth of the cavity is 3 to 100 μm.

In an embodiment, the insulating layer and the piezoelectric film are made of same material.

In a second aspect, the present application provides a bulk acoustic wave resonator, including: a silicon substrate, including an indentation; a resonant piezoelectric stack located on the silicon substrate and covering the indentation to form a cavity, the resonant piezoelectric stack including a piezoelectric film and a first electrode and a second electrode that are in contact with the piezoelectric film and are independent of each other; and a lead out pad, including a first pad and a second pad connected to the first electrode and the second electrode respectively.

In an embodiment, the bulk acoustic wave resonator further includes a groove, the groove penetrating the silicon substrate where the resonant piezoelectric stack is located to connect the cavity with atmosphere.

In an embodiment, the groove includes a first channel and a second channel, and the first channel and the second channel successively surround the first electrode and the second electrode at a predetermined interval.

In an embodiment, the resonant piezoelectric stack includes a second metal layer, the piezoelectric film, and a first metal layer sequentially stacked on the silicon substrate; the second metal layer includes a first sub-metal layer and a second sub-metal layer that are independent of each other, the first sub-metal layer is electrically connected with the first metal layer to form the first electrode, and the second sub-metal layer forms the second electrode.

In an embodiment, an orthographic projection of the first metal layer and the first sub-metal layer on the silicon substrate covers the cavity.

In an embodiment, orthographic projections of the first electrode and the second electrode on the silicon substrate are irregular.

In an embodiment, the resonant piezoelectric stack includes the piezoelectric film and a first metal layer sequentially stacked on the silicon substrate, the first metal layer includes a first IDT finger electrode and a second IDT finger electrode, the first IDT finger electrode forms the first electrode, and the second IDT finger electrode forms the second electrode.

In an embodiment, the resonant piezoelectric stack further includes a second metal layer located between the piezoelectric film and the silicon substrate, the second metal layer includes a third IDT finger electrode and a fourth IDT finger electrode; an orthographic projection of the first IDT finger electrode on the silicon substrate coincides with the third IDT finger electrode, and an orthographic projection of the second IDT finger electrode on the silicon substrate coincides with the fourth IDT finger electrode.

In an embodiment, the bulk acoustic wave resonator further includes a silicon dioxide layer between the silicon substrate and the resonant piezoelectric stack.

According to the bulk acoustic wave resonator and the preparation method for the bulk acoustic wave resonator according to the present application, the cavity is formed on a lower surface around the resonant piezoelectric stack in a bonding manner. Compared with a device in the prior art that needs to etch away most of the silicon substrate to form the cavity, the structure is more stable.

DETAILED DESCRIPTION OF THE EMBODIMENTS

To make the purpose, technical means, and advantages of the present application clearer, the application will hereafter be described in conjunction with the appended drawings.

Figure 1:
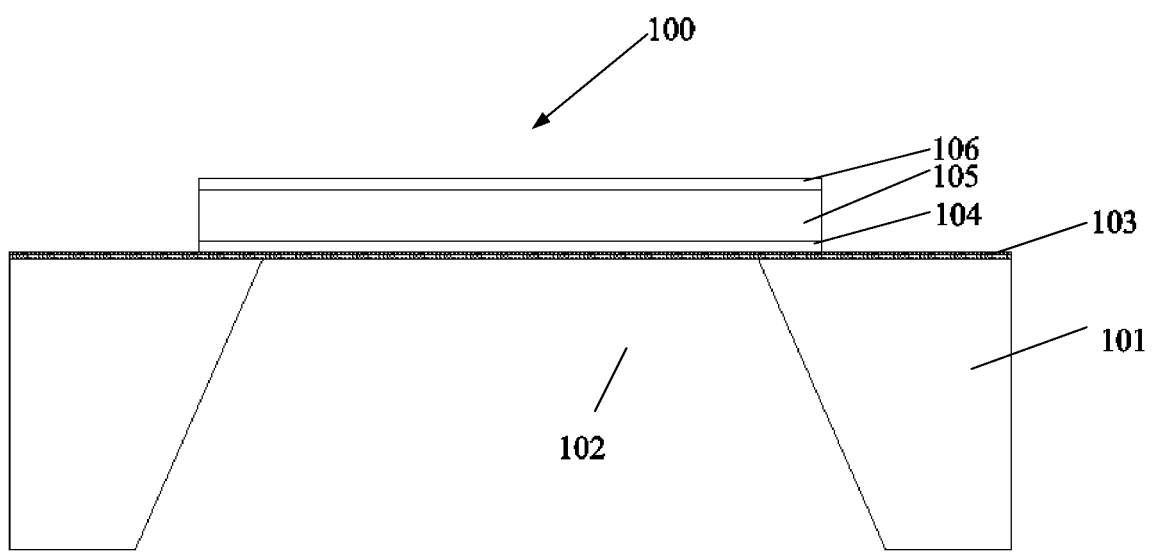
FIG. 1 is a structure diagram of a FBAR in the prior art.
Figure 2:
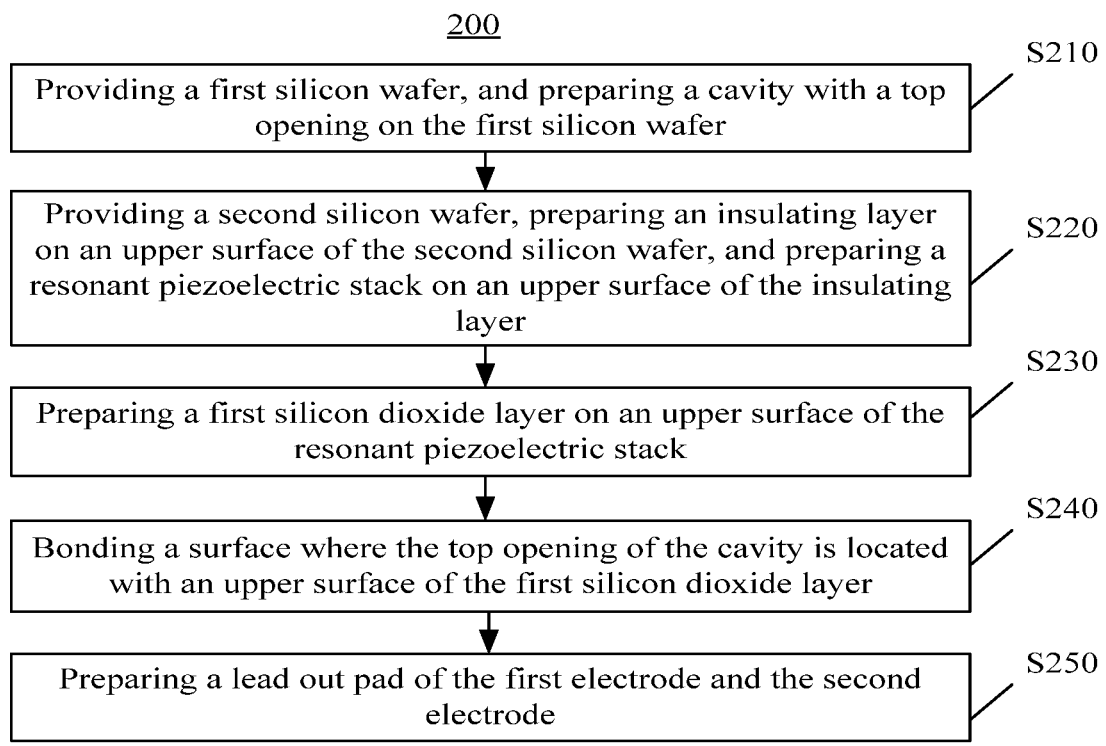
FIG. 2 is a flowchart of a preparation method for a bulk acoustic wave resonator according to an embodiment of the present application.

FIG. 2 is a flowchart of a preparation method for a bulk acoustic wave resonator according to an embodiment of the present application. As shown in FIG. 2, the preparation method 200 includes the following steps.

Step S210, providing a first silicon wafer, and preparing a cavity with a top opening on the first silicon wafer.

Step S220, providing a second silicon wafer, preparing an insulating layer on an upper surface of the second silicon wafer, and preparing a resonant piezoelectric stack on an upper surface of the insulating layer.

The resonant piezoelectric stack is a core component of the bulk acoustic wave resonator. The resonant piezoelectric stack includes a piezoelectric film, and a first electrode and a second electrode that are in contact with the piezoelectric film and are independent of each other. A working principle of the resonant piezoelectric stack is that the first electrode and the second electrode are used as a positive electrode and a negative electrode respectively. When the first electrode and the second electrode are connected to alternating voltage, an inverse piezoelectric effect of the piezoelectric film is used to generate mechanical vibration. The mechanical vibration propagates between the first electrode and the second electrode in a form of acoustic waves to form a standing wave. When frequency of the standing wave is equal to frequency of the alternating voltage, resonance is generated.

Step S230, preparing a first silicon dioxide layer on an upper surface of the resonant piezoelectric stack, the upper surface of the resonant piezoelectric stack including one or more of a surface of the piezoelectric film, a surface of the first electrode, and a surface of the second electrode.

Step S240, bonding a surface where the top opening of the cavity is located with an upper surface of the first silicon dioxide layer.

Step S250, preparing a lead out pad of the first electrode and the second electrode.

The preparation method of the bulk acoustic wave resonator shown in FIG. 2 will be described below in detail with specific examples in conjunction with the appended drawings.

FIG. 3a to FIG. 3i are structure diagrams of a device obtained in a process of preparing a FBAR according to the preparation method shown in FIG. 2 according to an embodiment of the present application. The resonant piezoelectric stack in Film Bulk Acoustic Resonator (FBAR) is a sandwich structure with a piezoelectric film sandwiched between an upper electrode and a lower electrode. A working principle of the FBAR is that the acoustic waves generated by the inverse piezoelectric effect of the piezoelectric film are transmitted longitudinally back and forth in an upper surface and a lower surface of the piezoelectric film, thereby forming longitudinal resonance.

Figure 3A:
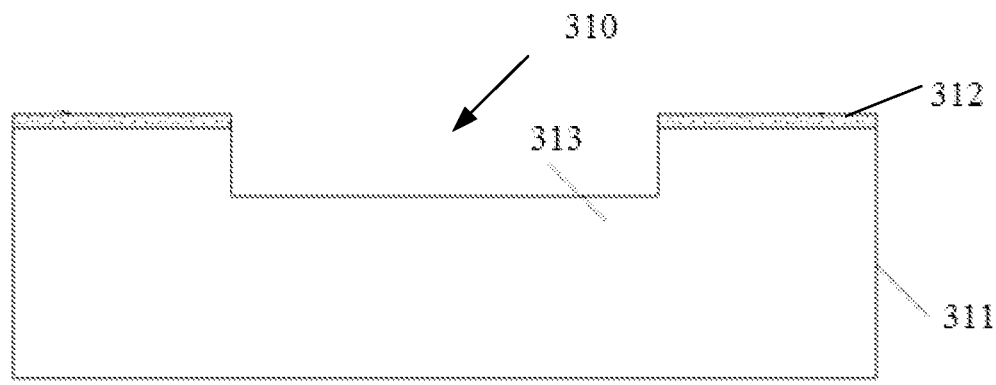
FIG. 3a to FIG. 3i are structure diagrams of a device obtained in a process of preparing a FBAR according to the preparation method shown in FIG. 2 according to an embodiment of the present application.

According to Step S210, referring to FIG. 3a, a first silicon substrate 311 is provided. A second silicon dioxide layer 312 is grown on an upper surface of the first silicon substrate 311 by using a process of liquid phase chemical vapor deposition (LPCVD). A thickness of the second silicon dioxide layer 312 is 500-6000 A. By using the second silicon dioxide layer 312 as a mask, a cavity 313 is etched by a photolithography process to form a device structure 310 shown in FIG. 3a. A depth of the cavity 313 may be 3-100 μm.

In an embodiment, Step S210 may also be performed as follows. By using photoresist as a mask, the cavity 313 is directly etched on the upper surface of the first silicon substrate 311. In other words, there is not the second silicon dioxide layer 312 on the upper surface of the first silicon substrate 311.

A difference between the above two preparation processes is that material on a surface of the top opening of the cavity 313, in a structure of the device formed by a former, is silicon dioxide, and material on the surface of the top opening of the cavity 313, in the structure of the device formed by a latter, is silicon. The surface where the top opening of the cavity 313 is subsequently used as a bonding party, determines whether a subsequent bonding is a SiO₂—SiO₂ bonding or a Si—SiO₂ bonding.

Figure 3B:
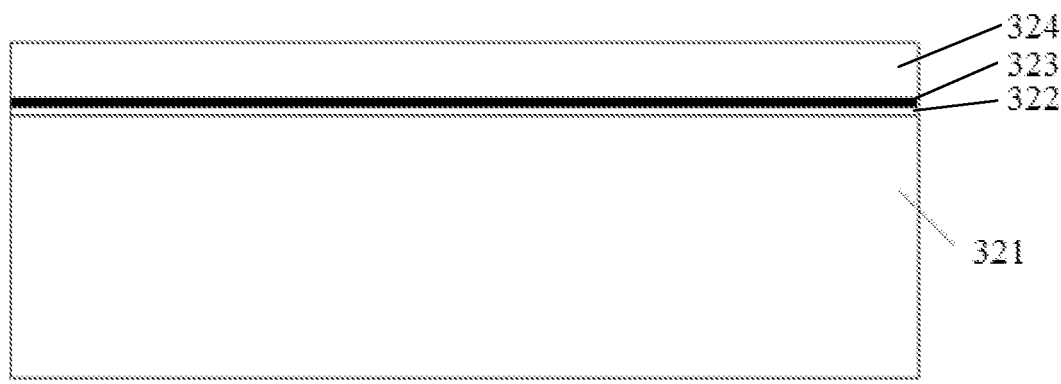

According to Step S220, first referring to FIG. 3b, a second silicon wafer is provided as a second silicon substrate 321. The insulating layer 322 is grown on an upper surface of the second silicon substrate 321. A first metal layer 323 is grown on the upper surface of the insulating layer 322. The piezoelectric film 324 is grown along the c-axis direction on an upper surface of the first metal layer 323 by using a process of LPCVD.

Material of the insulating layer 322 includes silicon dioxide, silicon nitride or aluminum nitride. A thickness of the insulating layer 322 is 300 to 500 nm. Material of the first metal layer 323 includes metal material such as aluminum, molybdenum, palladium, and titanium. A thickness of the first metal layer 323 is 200-500 nm. Material of the piezoelectric film 324 includes aluminum nitride, zinc oxide, lithium tantalate, and the like. A thickness of the piezoelectric film 324 is inversely related to frequency of FBAR resonator. Therefore, a thickness of the piezoelectric film 324 may be reasonably determined according to actual required resonance frequency. For example, the thickness of the piezoelectric film 324 is 0.5-2 μm.

In an embodiment, material of the insulating layer 322 is aluminum nitride. Material of the first metal layer 323 is molybdenum or palladium. Since molybdenum or palladium has good crystal compatibility with a c-axis direction of an aluminum nitride film, a better crystal quality and a crystal grain size may be obtained in this way.

In an embodiment, the piezoelectric film 324 is doped with metal elements. The metal elements doped include scandium, zirconium, calcium-titanium, magnesium-titanium, calcium-zirconium and the like. In this way, a effective coupling coefficient of the piezoelectric film 324 may be increased. The effective coupling coefficient of the piezoelectric film 324 is proportional to a bandwidth of the resonator, so that the bandwidth of the resonator may be increased.

Figure 3C:
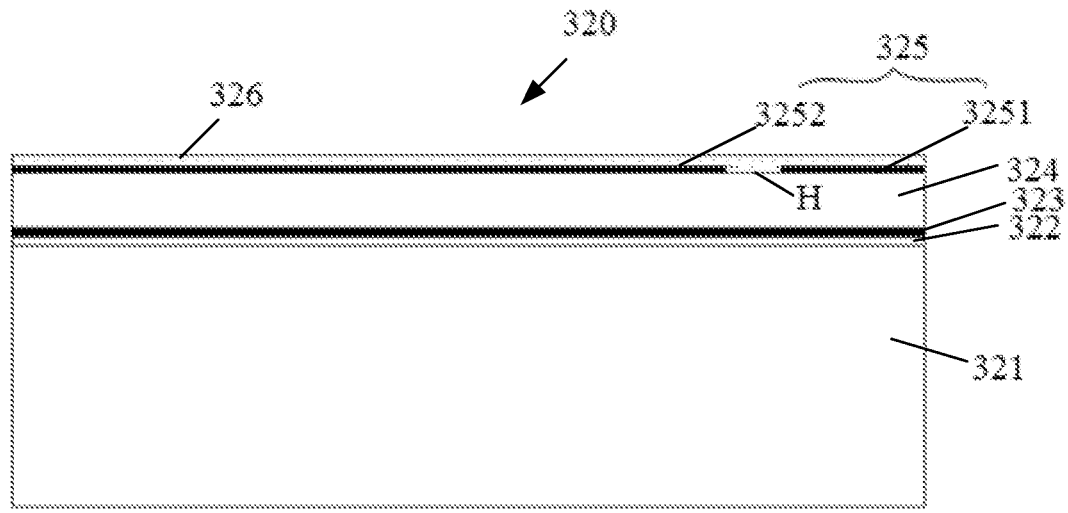

Then, referring to FIG. 3c, a second metal layer 325 is grown on an upper surface of the piezoelectric film 324. The second metal layer 325 includes a first sub-metal layer 3251 and a second sub-metal layer 3252 spaced apart from each other. That is, a gap H is included between the first sub-metal layer 3251 and the second sub-metal layer 3252.

Materials of the first sub-metal layer 3251 and the second sub-metal layer 3252 in the second metal layer 325 may be the same or different. When the materials of the first sub-metal layer 3251 and the second sub-metal layer 3252 are the same, a forming process of the first sub-metal layer 3251 and the second sub-metal layer 3252 includes: growing the second metal layer 325 on the upper surface of the piezoelectric film 324, and then etching the second metal layer 325 to form the first sub-metal layer 3251 and the second sub-metal layer 3252 that are independent and disconnected from each other. When the materials of the first sub-metal layer 3251 and the second sub-metal layer 3252 are different, the forming process of the first sub-metal layer 3251 and the second sub-metal layer 3252 includes: growing, by using a mask, the first sub-metal layer 3251 and the second sub-metal layer 3252 on different areas of the upper surface of the piezoelectric film 324 respectively.

According to Step S230, continuing to refer to FIG. 3c, a third silicon dioxide layer 326 is grown on an upper surface of the second metal layer 325 and the upper surface of the piezoelectric film 324 to form a device structure 320 as shown in FIG. 3c.

In an embodiment, the third silicon dioxide layer 326 includes a flat upper surface, which facilitates a preparation of subsequent film layers. A generation process of the third silicon dioxide layer 326 may adopt LPVCD process. A thickness of the third silicon dioxide layer 326 may be, for example, 1000 A to 3000 A.

Figure 3D:
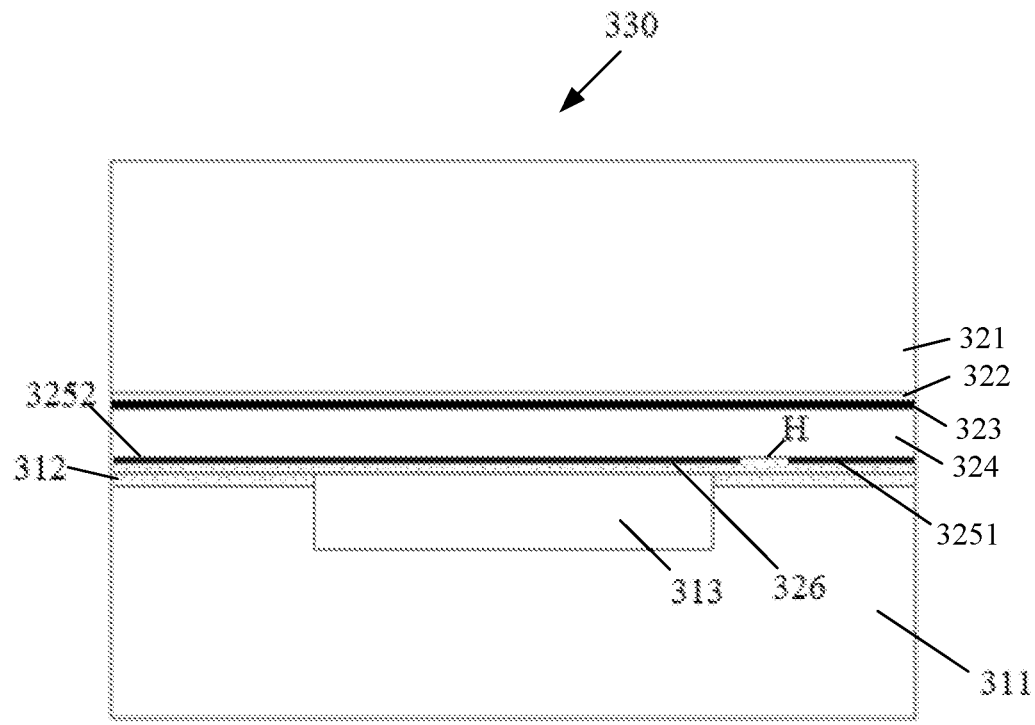

According to Step S240, referring to FIG. 3d, an upper surface of the device structure 310 shown in FIG. 3a and an upper surface of the device structure 320 shown in FIG. 3c are bonded to form a device structure 330 shown in FIG. 3d.

It should be noted here that when the upper surface of the device structure 310 shown in FIG. 3a includes the second silicon dioxide layer 302, a SiO₂—SiO₂ bond is formed between the device structure 310 shown in FIG. 3a and the device structure 320 shown in FIG. 3c. When the upper surface of the device structure 310 shown in FIG. 3a does not include the second silicon dioxide layer 302, a Si—SiO₂ bond is formed between the device structure 310 shown in FIG. 3a and the device structure 320 shown in FIG. 3c.

Figure 3E:
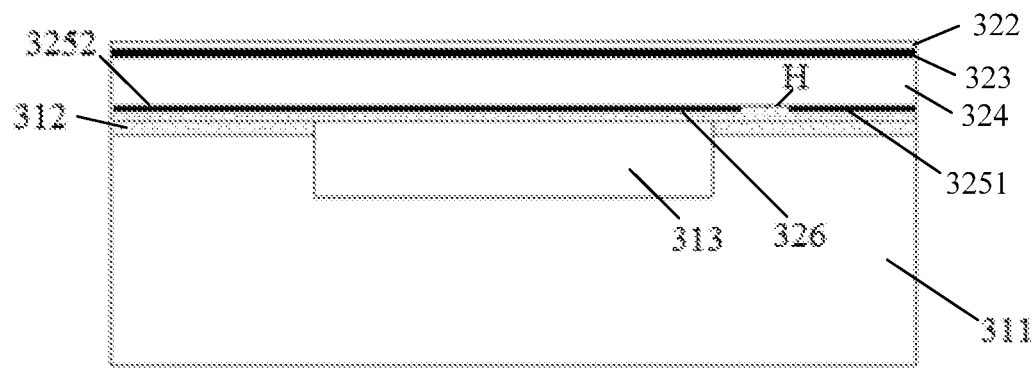

According to Step S250, first referring to FIG. 3e, based on the device structure 330 shown in FIG. 3d, the second silicon substrate 321 is removed by a chemical & mechanical polishing (CMP) process to expose the insulating layer 322.

Figure 3F:
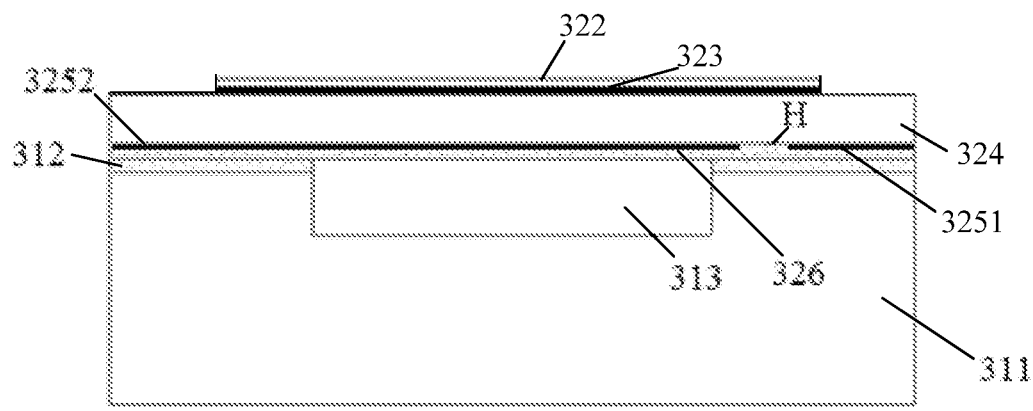

Then referring to FIG. 3f, a part of the insulating layer 322 and the first metal layer 323 under the part of the insulating layer 322 are etched away by lithography technology until the piezoelectric film 324 is exposed.

Figure 3G:
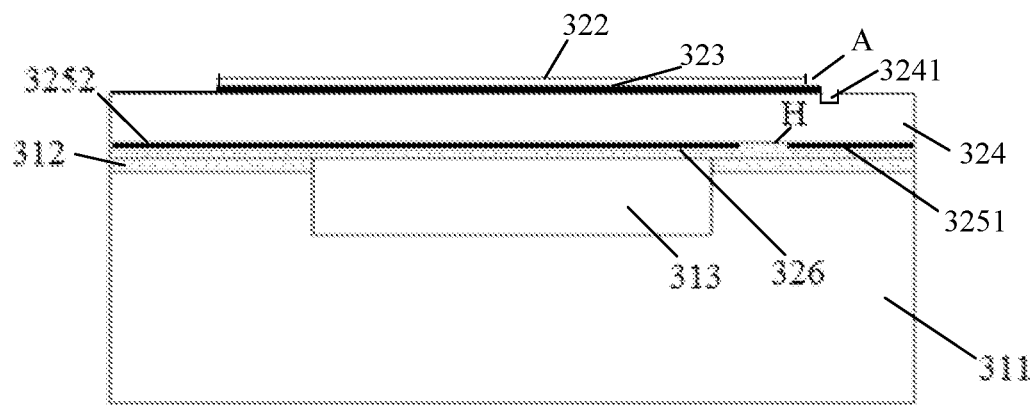

Next, referring to FIG. 3g, the insulating layer 322 in an edge area of the first metal layer 323 is removed by photolithography to obtain an exposed surface A of the first metal layer 323.

In an embodiment, materials of the insulating layer 322 and the piezoelectric film 324 are both aluminum nitride. In this case, the insulating layer 322 and the piezoelectric film 604 are made of same material. Therefore, when the insulating layer 322 at the edge area of the first metal layer 323 is photoetched, a part of the piezoelectric film 324 near the edge area of the first metal layer 323 may also be etched away, thereby forming an indentation 3241 in the piezoelectric film 324.

Figure 3H:
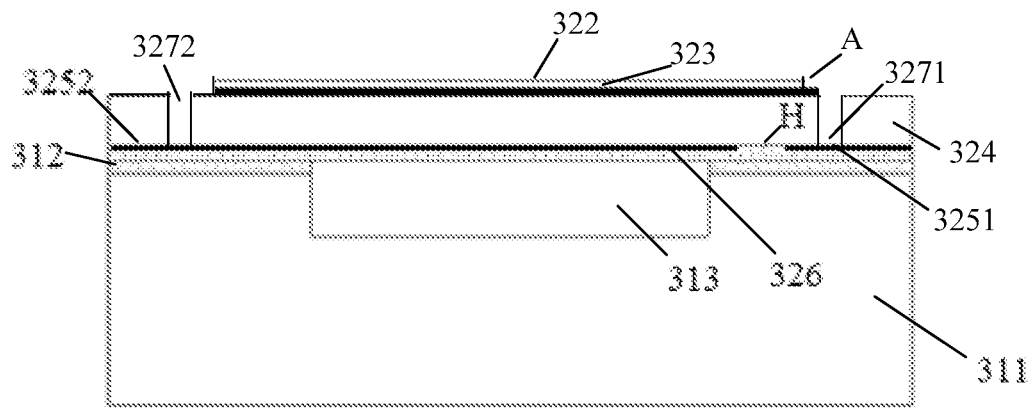

Next, referring to FIG. 3h, a first contact hole 3271 and a second contact hole 3272 respectively connected to the first sub-metal layer 3251 and the second sub-metal layer 3252 are etched in the upper surface of the piezoelectric film 324.

In an embodiment, when the piezoelectric film 324 includes the indentation 3241, the indentation 3241 is further etched to form the first contact hole 3271. That is, a depth of the indentation 3241, by an etching process, is deepened to expose the first sub-metal layer 3251, so as to form the first contact hole 3271.

Referring again to FIG. 3i, a lift-off technology is adopted to grow a first pad 3281 and a second pad 3282 in the first contact hole 3271 and the second contact hole 3272 respectively. The exposed surface A of the first metal layer 323 and the first sub-metal layer 3251 are electrically connected to form the first electrode connected to the first pad 3281, and the second sub-metal layer 3252 forms the second electrode connected to the second pad 3282.

Figure 3I:
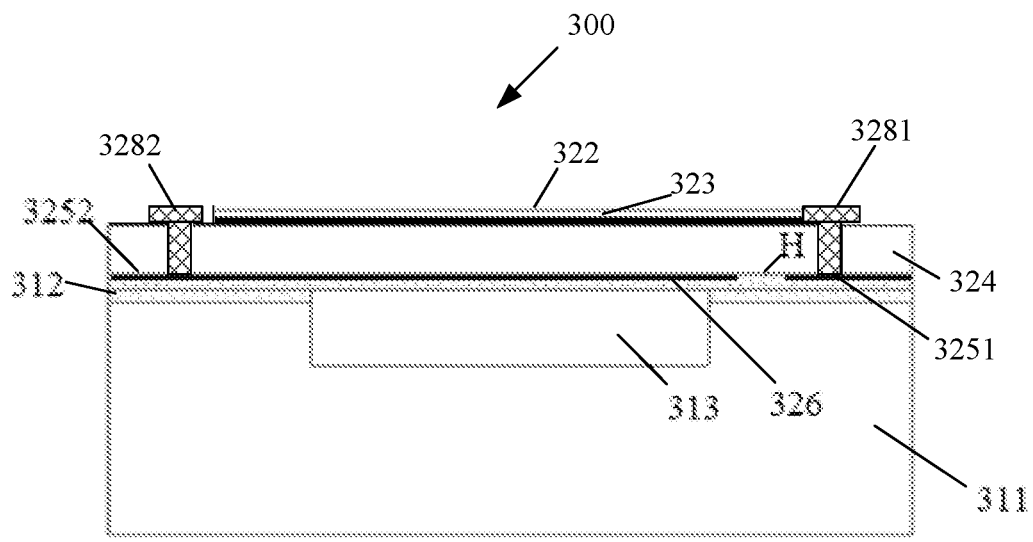

For example, as shown in FIG. 3i, the first electrode is led to the first pad 3281, and the second electrode is led to the second pad 3282. The first pad 3281 and the second pad 3282 are made of same material. The material of the first pad 3281 and the second pad 3282 may be gold or titanium-tungsten alloy. A thickness of the first pad 3281 and the second pad 3282 is 2000 A to 3000 A. The first pad 3281 and the second pad 3282 facilitate subsequent wire bonding, such as packaging test or probe test.

In an embodiment, an orthographic projection of the first electrode and/or the second electrode in a vertical direction is an irregular polygon. The irregular polygon mentioned here is an opposite concept to a regular polygon. For example, the orthographic projections of the first metal layer 323 and the first sub-metal layer 3215 forming the first electrode and the second sub-metal layer 3252 forming the second electrode are all irregular pentagons. In this way, it is possible to effectively reduce a parasitic mode formed by other acoustic waves other than the acoustic waves forming the main resonance.

The orthographic projections of the first electrode and/or the second electrode in the vertical direction are irregular patterns. According to FBAR provided by this embodiment, an acoustic cavity, namely the cavity 313, is formed under an overlapping area of the first electrode and the second electrode, that is, an area where the first metal layer 323 and the second sub-metal layer 3252 are directly opposed, thereby forming an air interface in a lower surface of the second electrode (specifically, the second silicon dioxide layer 326). Since an acoustic impedance of air is approximately zero, it may be used as a good acoustic wave limiting boundary. In this way, the air interface on the lower surface of the second electrode and the air interface on the upper surface of the first electrode (specifically, the insulating layer 322) cooperate with each other. The acoustic wave generated by FBAR is confined within a piezoelectric vibrating stack composed of the first electrode, the second electrode and the piezoelectric film 324.

FIG. 4a to FIG. 4i are structure diagrams of a device obtained in a process of preparing a LWR according to the fabrication method shown in FIG. 2 according to an embodiment of the present application. A difference in principle between Lamb wave resonator (LWR) and FBAR is that the acoustic wave in LWR propagates in a surface parallel to the piezoelectric film, thereby forming a transverse resonance.

According to Step S210, the device structure 310 as shown in FIG. 3a is prepared. This process is the same as the process of preparing the device structure 310 in FBAR, and will not be repeated here.

Figure 4A:
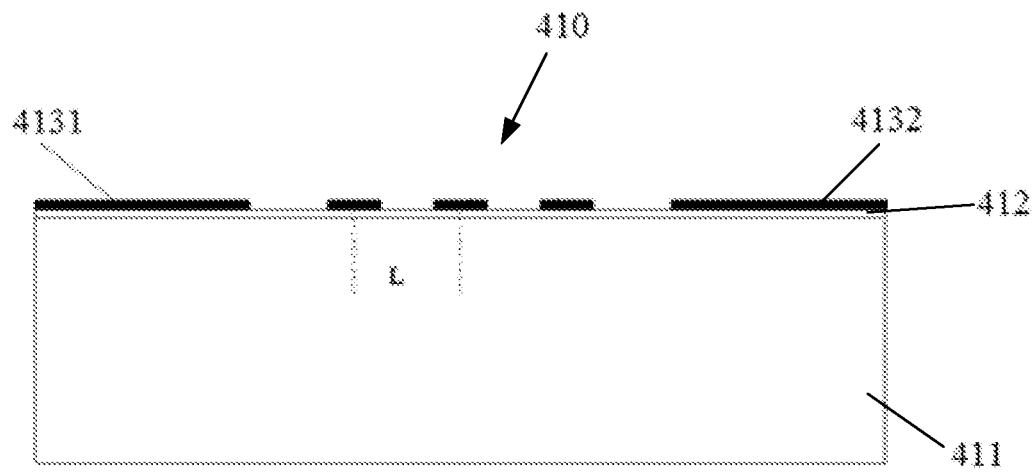
FIG. 4a to FIG. 4i are structure diagrams of a device obtained in a process of preparing a LWR according to the preparation method shown in FIG. 2 according to an embodiment of the present application.
Figure 4B:
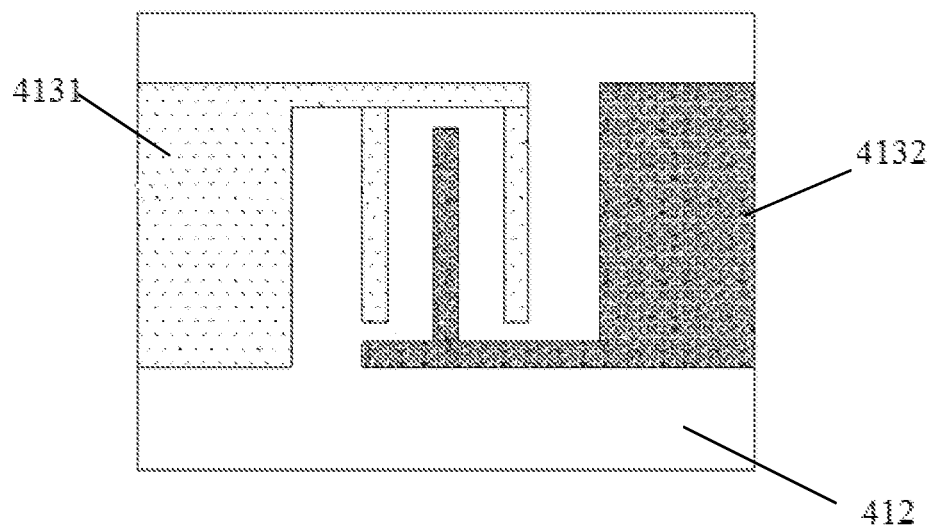

According to Step S220, first referring to FIG. 4a, a second wafer is provided as a second silicon substrate 411. An insulating layer 412 is deposited on an upper surface of the second silicon substrate 411. A first metal layer is grown on an upper surface of the insulating layer 412. The first metal layer is etched to form a first IDT finger electrode 4131 and a second IDT finger electrode 4132. A device structure 410 formed is shown in FIG. 4a, and a top view of the device structure 410 is shown in FIG. 4b.

The first IDT finger electrode 4131 includes at least one first IDT finger, the second IDT finger electrode 4132 includes at least one second IDT finger, and the at least one first IDT finger and the at least one second IDT finger are alternately arranged at an interval. A distance L between two adjacent IDT fingers determines frequency of LWR. Specifically, the distance L between two adjacent IDT fingers is negatively correlated with the frequency of LWR. Therefore, the distance L between two adjacent IDT fingers may be set reasonably according to a required frequency. A number of the first IDT finger and the second IDT finger may be arbitrary. For example, as shown in FIG. 4a and FIG. 4b, the first IDT finger electrode 4131 includes two IDT fingers, and the second IDT finger electrode 4132 includes one IDT finger.

Material of the first metal layer includes metal materials such as aluminum, molybdenum, palladium, and titanium. A thickness of the first metal layer is 200-500 nm. In an embodiment, material of the insulating layer 412 is aluminum nitride, and material of the first metal layer is molybdenum or palladium. Since molybdenum or palladium has good crystal compatibility with a c-axis direction of an aluminum nitride film, a better crystal quality and a crystal grain size may be obtained in this way.

Figure 4C:
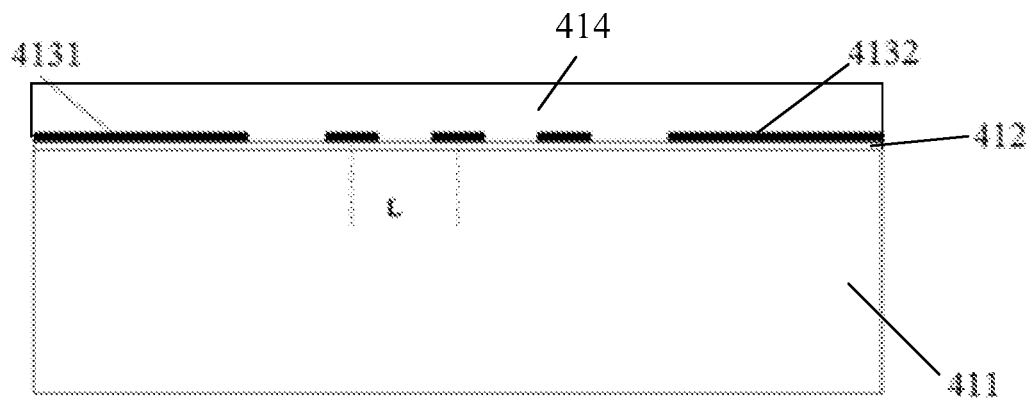

Then referring to FIG. 4c, a piezoelectric film 414 is grown on an surface of the first IDT finger electrode 4131, the second IDT finger electrode 4132 and the insulating layer 412. Preferably, the piezoelectric film 414 includes a flat upper surface to facilitate a fabrication of each subsequent film layer.

Material of the piezoelectric film 414 includes aluminum nitride, zinc oxide, lithium tantalate, and the like. A ratio of a wavelength of the acoustic wave to a thickness of the piezoelectric film 414 is less than 0.4, so that a higher acoustic wave propagation velocity may be obtained.

In an embodiment, the piezoelectric film 414 is grown along the c-axis direction on an upper surface of the first IDT finger electrode 4131 and the second IDT finger electrode 4132 by using a process of LPCVD.

In an embodiment, the piezoelectric film 414 is doped with metal element. The metal element doped includes scandium, zirconium, calcium-titanium, magnesium-titanium, calcium-zirconium and the like. In this way, a effective coupling coefficient of the piezoelectric film 414 may be increased. The effective coupling coefficient of the piezoelectric film 414 is proportional to a bandwidth of the LWR resonator, so that the bandwidth of the LWR resonator may be increased.

Figure 4D:
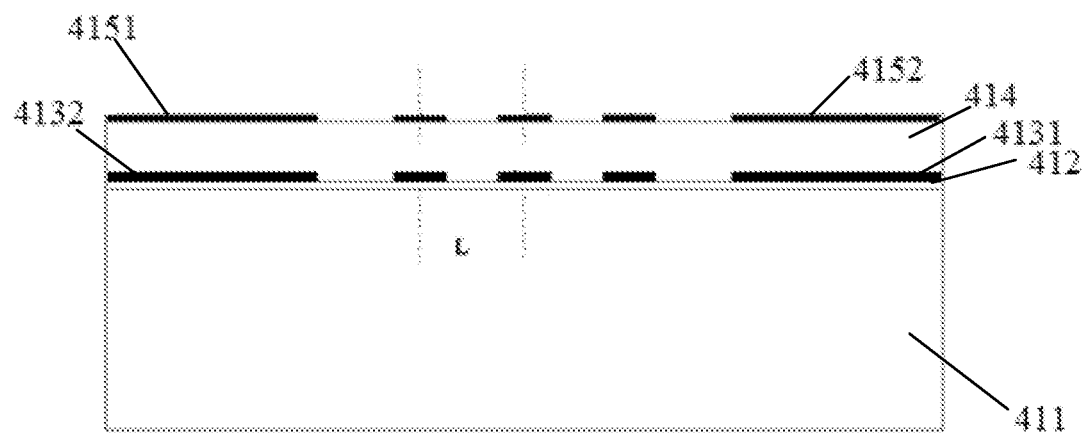

Next, referring to FIG. 4d, a second metal layer is grown on the upper surface of the piezoelectric film 414, and the second metal layer is etched to form a third IDT finger electrode 4151 and a fourth IDT finger electrode 4152. Orthographic projections of the third IDT finger electrode 4151 and the fourth IDT finger electrode 4152 are coincided with the first IDT finger electrode 4131 and the second IDT finger electrode 4132 respectively.

Material of the second metal layer includes metal material such as aluminum, molybdenum, palladium, and titanium. A thickness of the second metal layer is 200-500 nm. A thickness of the second silicon dioxide layer 416 is 1000 A to 3000 A.

In an embodiment, a material of the piezoelectric film 414 is aluminum nitride, and a material of the second metal layer is molybdenum or palladium. Since molybdenum or palladium has good crystal compatibility with a c-axis direction of an aluminum nitride film, a better crystal quality and a crystal grain size may be obtained in this way.

Figure 4E:
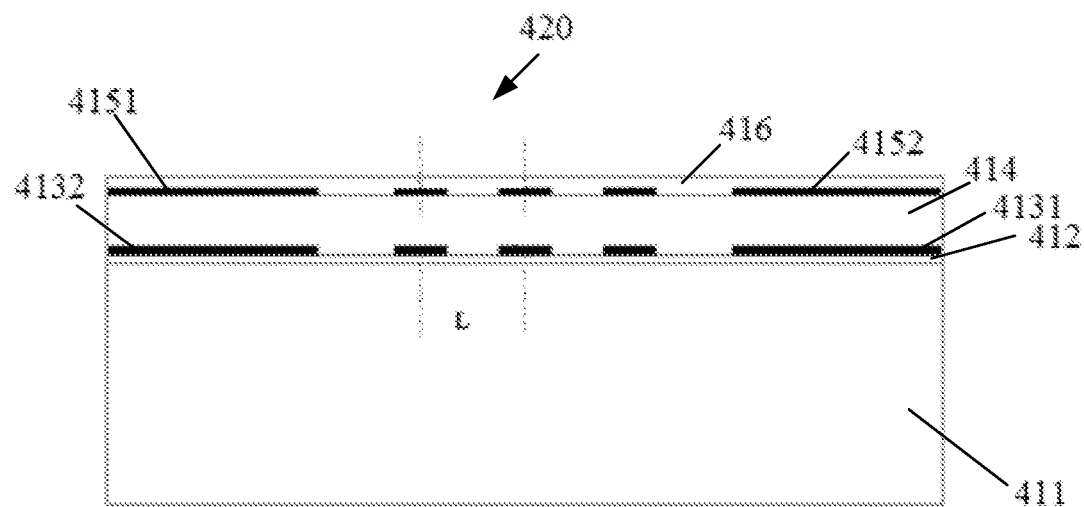

According to Step S230, referring to FIG. 4e, a third silicon dioxide layer 416 is grown on an upper surface of the third IDT finger electrode 4151, the fourth IDT finger electrode 4152, and the piezoelectric film 414 to form the device structure 420 shown in FIG. 4d.

Figure 4F:
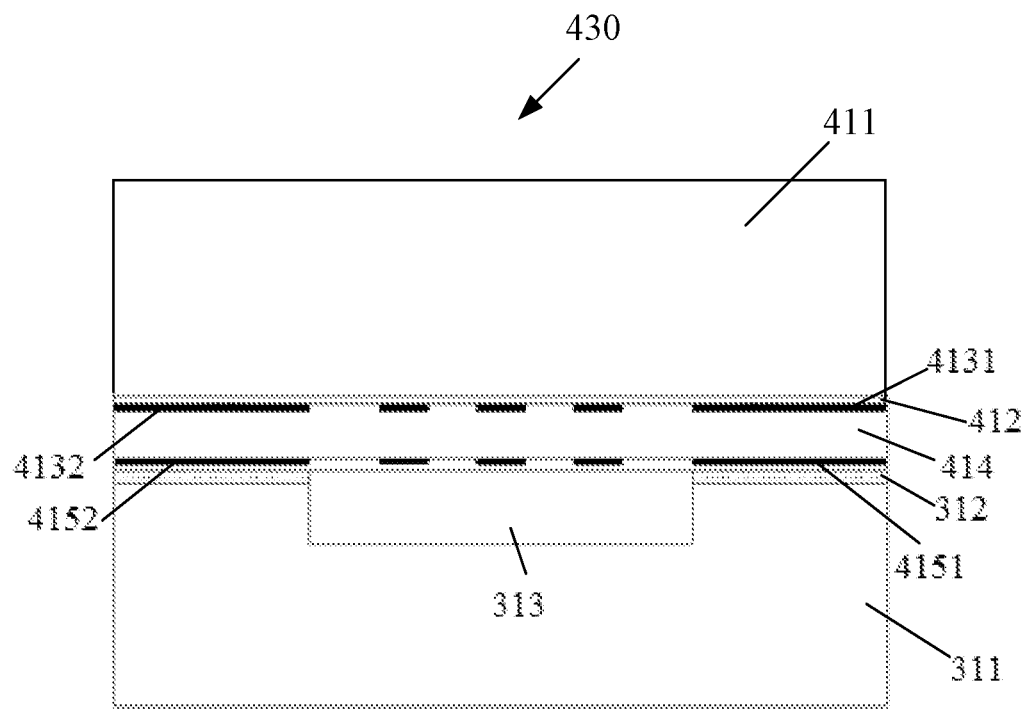

According to Step S240, referring to FIG. 4f, an upper surface of the device structure 310 shown in FIG. 3a and an upper surface of the device structure 420 shown in FIG. 4e are bonded to form a device structure 430 shown in FIG. 4f.

It should be noted here that when the upper surface of the device structure 300 shown in FIG. 3a includes the first silicon dioxide layer 302, a $SiO_2$—$SiO_2$ bond is formed between the device structure 300 shown in FIG. 3a and the device structure 420 shown in FIG. 4c. When the upper surface of the device structure 300 shown in FIG. 3a does not include the first silicon dioxide layer 312, a Si—$SiO_2$ bond is formed between the device structure 300 shown in FIG. 3a and the device structure 420 shown in FIG. 4c.

Figure 4G:
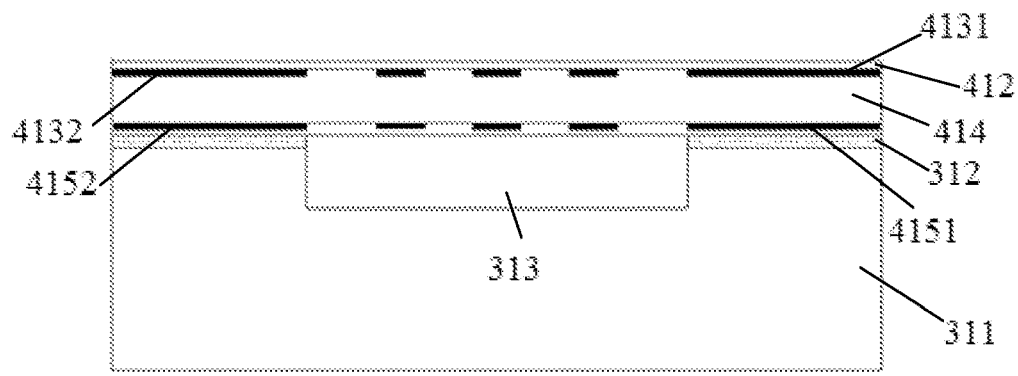

According to Step S250, firstly referring to FIG. 4g, based on the device structure 430 shown in FIG. 4f, the second silicon substrate 411 is removed by CMP process to expose the insulating layer 412.

Figure 4H:
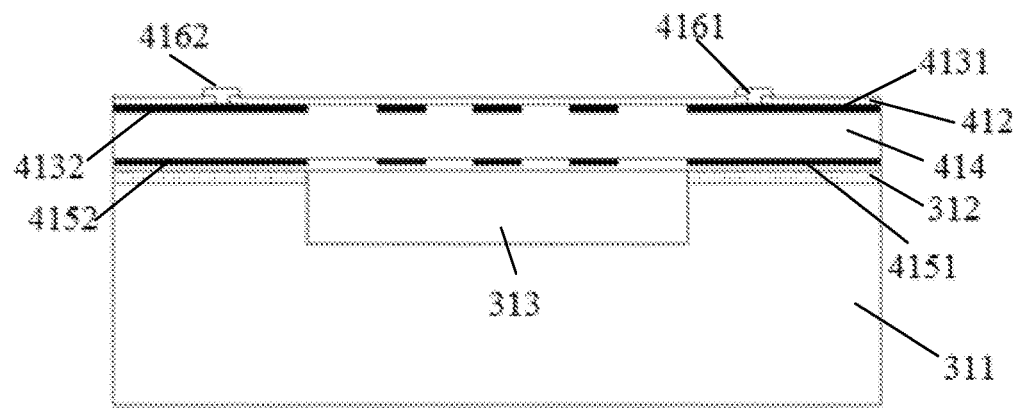

Next, referring to FIG. 4h, a first contact hole and a second contact hole respectively connected to the first IDT finger electrode 4131 and the second IDT finger electrode 4132 are etched in the upper surface of the insulating layer 412. Then, a lift-off technology is adopted to grow a first pad 4161 and a second pad 4162 corresponding to the first IDT finger electrode 4131 and the second IDT finger electrode 4132 respectively in the first contact hole and the second contact hole respectively.

The first pad 4161 and the second pad 4162 are made of same material. The material of the first pad 4161 and the second pad 4162 may be gold or titanium-tungsten alloy. A thickness of the first pad 4161 and the second pad 4162 is 2000 A to 3000 A. The first pad 4161 and the second pad 4162 facilitate subsequent wire bonding, such as packaging test or probe test.

It should be noted that the third IDT finger electrode 4151 and the fourth IDT finger electrode 4152 are suspended, that is, there is no lead out of a pad, and there is no need to connect any potential later.

Figure 4I:
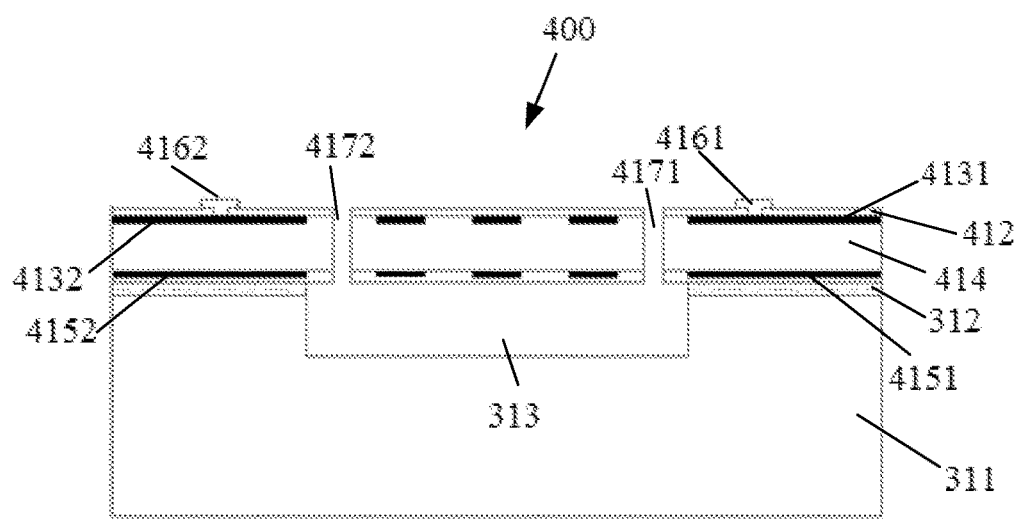

In the process of preparing LWR, the fabrication method shown in FIG. 2 also includes a step of preparing an air interface. Specifically, referring to FIG. 4i, a groove is etched by a photolithography process on the surface of the insulating layer 412 to communicate with the cavity, thereby forming an air interface to form an acoustic wave isolation region, so far, LWR 400 shown in FIG. 4i is obtained.

In this embodiment, the groove includes a first channel 4171 and a second channel 4172. The first channel 4171 and the second channel 4172 successively surround the first IDT finger electrode 4131 and the second IDT finger electrode 4132 at a predetermined interval. That is, the first channel 4171 and the second channel 4172 form an encircling circle surrounding the first IDT finger electrode 4131 and the second IDT finger electrode 4132, and there is an interval between the first channel 4171 and the second channel 4172. The interval between the first channel 4171 and the second channel 4172 may be used to provide a space for a metal connection line between the first IDT finger electrode 4131 and the first pad 4161, and the second IDT finger electrode 4132 and the second pad 4162.

According to LWR provided in this embodiment, by providing the groove surrounding the first IDT finger 4131 and the second IDT finger 4132, the groove forms an air reflection interface. Therefore, the acoustic wave is confined within a transverse resonant piezoelectric stack composed of the piezoelectric film 414, the first IDT finger electrode 4131, and the second IDT finger electrode 4132.

There are altogether four kinds of electrode configurations, i.e. only IDT on the top of the resonator (represented by IDT-open), IDT on the top but with a floating electrode at the bottom of the resonator (represented by IDT-floating), IDT on the top with a grounded electrode at the bottom of the resonator (represented by IDT-grounded), and IDT on both sides of the resonator (represented by IDT-IDT). LWR in this embodiment is a IDT-floating type. That is, the third IDT finger electrode 4151 and the fourth IDT finger electrode 4152 in the second metal layer do not need to be connected to any potential, and only for obtaining a higher coupling coefficient. Those skilled in the art should understand that a same fabrication method may also be used to prepare LWR of a IDT-open type. The only difference from LWR of IDT-floating type shown in FIG. 4i is that there is no the third IDT finger electrode 4151 and the fourth IDT finger electrode 4152 in a chip. In this case, it is equivalent to omitting the steps of preparing the second metal layer and etching to form the third IDT finger electrode 4151 and the fourth IDT finger electrode 4152. Or, it is also possible to prepare LWR which upper and lower electrodes are IDT-IDT type. In this case, a step to further prepare the pad of the third IDT finger electrode 4151 and the fourth IDT finger electrode 4152 is necessary.

According to the fabrication method for the bulk acoustic wave resonator according to any embodiment of the present application, an air isolation region is formed around the resonant piezoelectric stack (including a lower surface or surroundings) by bonding. Compared with the air isolation region formed by the etching process in the prior art, the device structure is more stable. At the same time, compared with the prior art fabrication method for forming the cavity by deep reactive ion etching, then filling the cavity with a sacrificial layer material, such as phosphosilicate glass, and finally releasing to expose the cavity, the fabrication process is less difficult and the equipment cost is low. Compared with bulk acoustic wave resonator with a bragger reflection layer in the prior art, a quality factor is higher.

It should be understood that the qualifiers "first", "second", "third" and "fourth" used in the description of the embodiments of this application are only used to explain the technical solution more clearly, and cannot be used to limit the protection scope of the present application.

The above embodiments only the preferred embodiments of the present application, and are not intended to limit the present application. Any modification, equivalent replacement, etc. made within the spirit and principles of the present application should be included in the scope of protection of the present application.

What is claimed is:

1. A bulk acoustic wave resonator, comprising:
   a device structure comprising a silicon substrate, the silicon substrate comprising an indentation partially penetrating the silicon substrate;
   a third silicon dioxide layer bonded on the device structure, the third silicon dioxide layer covering the indentation to form a cavity inside the silicon substrate, and a material of the third silicon dioxide layer being silicon dioxide;
   a resonant piezoelectric stack on the third silicon dioxide layer, the resonant piezoelectric stack comprising a piezoelectric film, and a first electrode and a second electrode that are in contact with the piezoelectric film and are independent of each other; and
   a lead out pad, comprising a first pad and a second pad connected to the first electrode and the second electrode respectively,
   wherein there is a bonding interface between the device structure and the third silicon dioxide layer, and the bonding interface comprises a $SiO_2$—$SiO_2$ interface or a Si—$SiO_2$ interface.

2. The bulk acoustic wave resonator according to claim 1, further comprising a groove, the groove penetrating the silicon substrate where the resonant piezoelectric stack is located to connect the cavity with atmosphere.

3. The bulk acoustic wave resonator according to claim 2, wherein the groove comprises a first channel and a second channel, and the first channel and the second channel successively surround the first electrode and the second electrode at a predetermined interval.

4. The bulk acoustic wave resonator according to claim 1, wherein: the resonant piezoelectric stack comprises a second metal layer, the piezoelectric film, and a first metal layer sequentially stacked on the silicon substrate; the second metal layer comprises a first sub-metal layer and a second sub-metal layer that are independent of each other, the first sub-metal layer is electrically connected with the first metal layer to form the first electrode, and the second sub-metal layer forms the second electrode.

5. The bulk acoustic wave resonator according to claim 4, wherein an orthographic projection of the first metal layer and the first sub-metal layer on the silicon substrate covers the cavity.

6. The bulk acoustic wave resonator according to claim 4, wherein orthographic projections of the first electrode and the second electrode on the silicon substrate are irregular.

7. The bulk acoustic wave resonator according to claim 1, wherein: the resonant piezoelectric stack comprises the piezoelectric film and a first metal layer sequentially stacked on the silicon substrate, the first metal layer comprises a first IDT finger electrode and a second IDT finger electrode, the first IDT finger electrode forms the first electrode, and the second IDT finger electrode forms the second electrode.

8. The bulk acoustic wave resonator according to claim 7, wherein: the resonant piezoelectric stack further comprises a second metal layer located between the piezoelectric film and the silicon substrate, the second metal layer comprises a third IDT finger electrode and a fourth IDT finger electrode; an orthographic projection of the first IDT finger electrode on the silicon substrate coincides with the third IDT finger electrode, and an orthographic projection of the second IDT finger electrode on the silicon substrate coincides with the fourth IDT finger electrode.

* * * * *